(12) United States Patent
Mo

(10) Patent No.: US 11,715,654 B2
(45) Date of Patent: Aug. 1, 2023

(54) TEMPERATURE ADJUSTING DEVICE

(71) Applicant: Tokyo Electron Limited, Tokyo (JP)

(72) Inventor: Yun Mo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 125 days.

(21) Appl. No.: 16/936,586

(22) Filed: Jul. 23, 2020

(65) Prior Publication Data

US 2021/0028029 A1 Jan. 28, 2021

(30) Foreign Application Priority Data

Jul. 24, 2019 (JP) .................................. 2019-136176

(51) Int. Cl.

| | |
|---|---|
| *H01L 21/67* | (2006.01) |
| *H01L 21/687* | (2006.01) |
| *H01J 37/20* | (2006.01) |
| *H01L 21/683* | (2006.01) |
| *C23C 16/458* | (2006.01) |

(52) U.S. Cl.
CPC .. *H01L 21/67109* (2013.01); *H01L 21/68785* (2013.01); *C23C 16/4586* (2013.01); *H01J 37/20* (2013.01); *H01L 21/6833* (2013.01)

(58) Field of Classification Search
CPC ......... H01L 21/67109; H01L 21/68785; H01L 21/6833; H01L 21/6831; C23C 16/4586; C23C 16/46; H01J 37/20; H01J 37/32522; H01J 37/32724; H01J 2237/002; B23Q 3/15; H02N 13/00

See application file for complete search history.

(56) References Cited

U.S. PATENT DOCUMENTS

2014/0008020 A1* 1/2014 Nagayama ........ H01J 37/32724
137/2
2016/0118285 A1* 4/2016 Takada ................ H01L 21/6831
165/53

FOREIGN PATENT DOCUMENTS

| JP | S59-074632 A | 4/1984 |
| JP | H09-312281 A | 12/1997 |
| JP | 2014-011382 A | 1/2014 |

OTHER PUBLICATIONS

Duryodhan, V. S. et al. A simple and novel way of maintaining constant wall temperature in microdevices. Sci. Rep. 6, 18230; doi: 10.1038/srep18230 (2016) (Year: 2016).*

* cited by examiner

*Primary Examiner* — Ermias T Woldegeorgis
(74) *Attorney, Agent, or Firm* — Pearne & Gordon LLP

(57) ABSTRACT

A temperature adjusting device includes a first member and a flow path. The first member has thereon a first surface as a temperature control target. The flow path is formed within the first member along the first surface. A first end of the flow path serves as an inlet opening through which a heat transfer medium is introduced and a second end of the flow path serves as an outlet opening through which the heat transfer medium is discharged. The flow path is formed such that a thermal resistance between the first surface and the flow path increases as the flow path goes from the outlet opening toward the inlet opening.

7 Claims, 9 Drawing Sheets

TEMPERATURE ADJUSTING DEVICE

CROSS-REFERENCE TO RELATED APPLICATION

This application claims the benefit of Japanese Patent Application No. 2019-136176 filed on Jul. 24, 2019, the entire disclosures of which are incorporated herein by reference.

TECHNICAL FIELD

The various aspects and embodiments described herein pertain generally to a temperature adjusting device.

BACKGROUND

Patent Document 1 describes a plasma processing apparatus configured to cool a substrate by allowing a coolant to flow in a flow path within a placing table to adjust a temperature of the substrate placed on the placing table.

Patent Document 1: Japanese Patent Laid-open Publication No. 2014-011382

SUMMARY

In one exemplary embodiment, a temperature adjusting device includes a first member and a flow path. The first member has thereon a first surface as a temperature control target. The flow path is formed within the first member along the first surface. A first end of the flow path serves as an inlet opening through which a heat transfer medium is introduced and a second end of the flow path serves as an outlet opening through which the heat transfer medium is discharged. The flow path is formed such that a thermal resistance between the first surface and the flow path increases as the flow path goes from the outlet opening toward the inlet opening.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
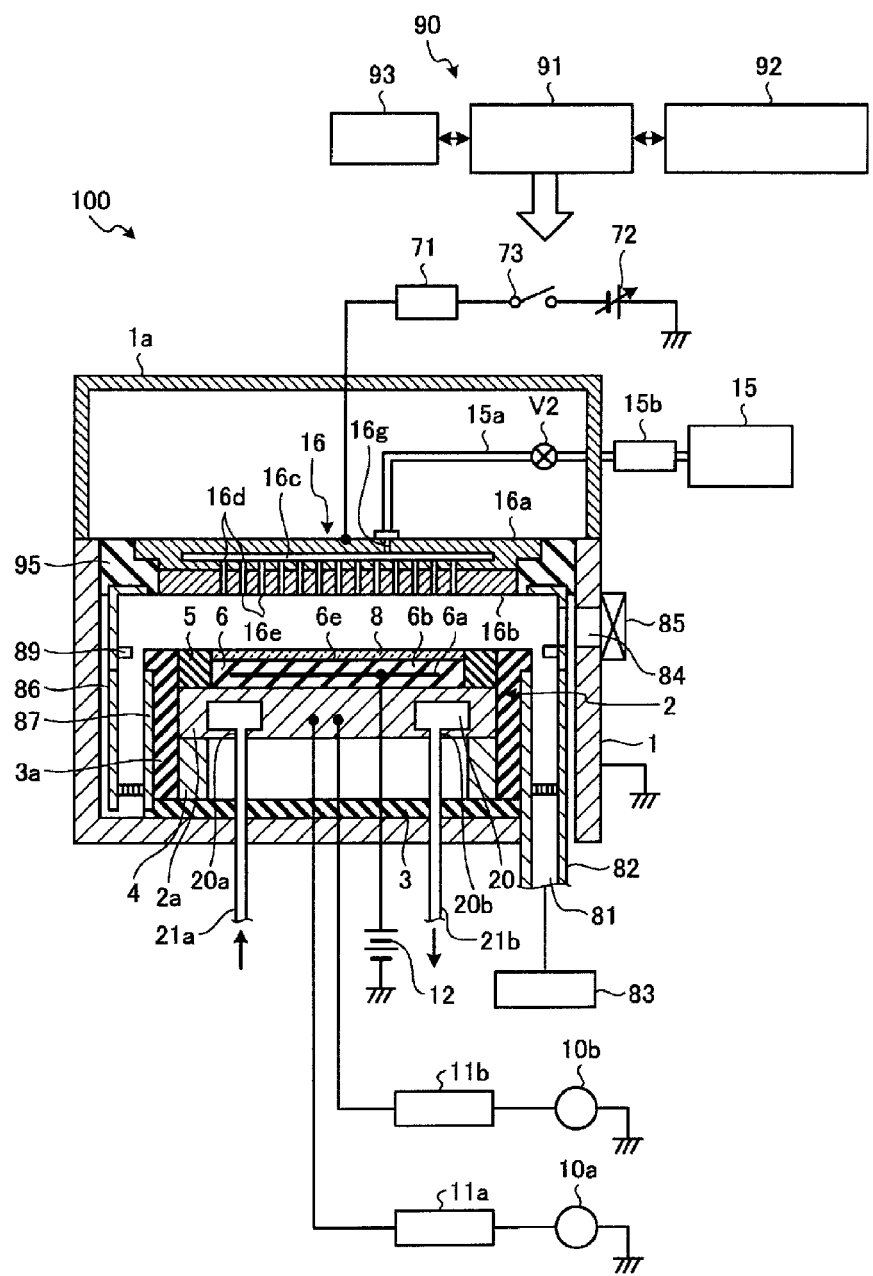
FIG. 1 is a schematic cross sectional view illustrating a configuration example of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment of a temperature adjusting device will be explained in detail with reference to the accompanying drawings. Further, the present disclosure is not limited by the present exemplary embodiment.

Conventionally, a plasma processing apparatus is configured to cool a substrate by allowing a coolant to flow in a flow path provided within a placing table. In the plasma processing apparatus, however, heat from plasma is transferred to the coolant through the substrate and the placing table, and a temperature of the coolant is varied within the flow path by this heat from the plasma. As a result, there is generated a difference between a temperature of the coolant at an inlet of the flow path within the placing table and a temperature of the coolant at an outlet thereof, so that a temperature difference is generated within a placing surface, which causes a temperature difference within the substrate placed on the placing table. In this regard, it is required to reduce the temperature difference within the surface.

EXEMPLARY EMBODIMENT

[Configuration of Plasma Processing Apparatus]

FIG. 1 is a schematic cross sectional view illustrating an example configuration of a plasma processing apparatus 100 according to an exemplary embodiment. The plasma processing apparatus 100 is hermetically configured and includes a processing vessel 1 which is electrically grounded. The processing vessel 1 has a cylindrical shape and is made of, by way of example, aluminum or the like. The processing vessel 1 has therein a processing space in which plasma is formed. A placing table 2 configured to horizontally support a semiconductor wafer (hereinafter, simply referred to as "wafer") 8 as a substrate is provided within the processing vessel 1. In the present exemplary embodiment, the placing table 2 corresponds to a temperature adjusting device.

The placing table 2 includes a base 2a and an electrostatic chuck (ESC) 6. The base 2a is made of a conductive metal, for example, aluminum and has a function as a lower electrode. The electrostatic chuck 6 has a function of attracting the wafer 8 electrostatically. The placing table 2 is supported by a support 4. The support 4 is supported by a supporting member 3 which is made of, by way of non-limiting example, quartz or the like. Further, a focus ring 5 formed of, by way of non-limiting example, single crystalline silicon is disposed on an upper peripheral portion of the placing table 2. Further, a cylindrical inner wall member 3a made of, by way of example, but not limitation, quartz is disposed within the processing vessel 1, surrounding the placing table 2 and the support 4.

A first RF power supply 10a is connected to the base 2a via a first matching device 11a. Further, a second RF power supply 10b is also connected to the base 2a via a second matching device 11b. The first RF power supply 10a is used for plasma formation and is configured to supply a high frequency power of a preset frequency to the base 2a of the placing table 2. Further, the second RF power supply 10b is used for ion attraction (bias) and is configured to supply a high frequency power having a predetermined frequency lower than that of the first RF power supply 10a to the base 2a of the placing table 2. In this way, the placing table 2 is configured such that the high frequency powers having the different frequencies are applied thereto from the first RF power supply 10a and the second RF power supply 10b. Meanwhile, a shower head 16 serving as an upper electrode is disposed above the placing table 2, facing the placing table 2 in parallel. The shower head 16 and the placing table 2 serve as a pair of electrodes (upper electrode and lower electrode).

The electrostatic chuck 6 has a disk shape with a flat top surface, and this top surface is configured as a placing surface 6e on which the wafer 8 is placed. The electrostatic chuck 6 includes an insulator 6b and an electrode 6a embedded in the insulator 6b, and the electrode 6a is connected with a DC power supply 12. The electrostatic chuck 6 is configured to attract the wafer 8 by a coulomb force generated by a DC voltage applied to the electrode 6a from the DC power supply 12.

A flow path 20 is formed within the base 2a. One end of the flow path 20 is connected with a coolant inlet line 21a, and the other end of the flow path 20 is connected with a coolant outlet line 21b. The coolant inlet line 21a and the coolant outlet line 21b are connected to a non-illustrated chiller unit. The flow path 20 is located under the wafer 8 and serves to absorb heat of the wafer 8. The plasma processing apparatus 100 is configured to control the placing table 2 to a preset temperature by circulating a coolant, for example, cooling water or an organic solvent such as GALDEN from the chiller unit in the flow path 20 via the coolant inlet line 21a and the coolant outlet line 21b.

Further, the plasma processing apparatus 100 may be configured to supply a heat transfer gas to a rear surface of the wafer 8 to control a temperature of the wafer 8 independently. By way of example, a gas supply line for supplying the heat transfer gas (backside gas) such as a helium gas to the rear surface of the wafer 8 may be formed through the placing table 2. The gas supply line is connected to a non-illustrated gas source. With this configuration, the wafer 8 attracted to and held on the top surface of the placing table 2 by the electrostatic chuck 6 is regulated to a preset temperature.

The shower head 16 is provided at a ceiling portion of the processing vessel 1. The shower head 16 includes a main body 16a and a ceiling plate 16b serving as an electrode plate. The shower head 16 is supported at an upper portion of the processing vessel 1 with an insulating member 95 therebetween. The main body 16a is made of a conductive material, for example, aluminum having an anodically oxidized surface, and configured to support the ceiling plate 16b thereunder in a detachable manner.

A gas diffusion space 16c is provided within the main body 16a. Further, the main body 16a is provided with a multiple number of gas through holes 16d located under the gas diffusion space 16c. The ceiling plate 16b is provided with gas discharge holes 16e which are formed through the ceiling plate 16b in a thickness direction thereof to be overlapped with the gas through holes 16d, respectively. With this configuration, a processing gas supplied into the gas diffusion space 16c is supplied into the processing vessel 1 through the gas through holes 16d and the gas discharge holes 16e while being distributed in a shower shape.

The main body 16a is provided with a gas inlet opening 16g through which the processing gas is introduced into the gas diffusion space 16c. One end of a gas supply line 15a is connected to the gas inlet opening 16g, and the other end of this gas supply line 15a is connected to a processing gas source (gas supply) 15 configured to supply the processing gas. The gas supply line 15a is provided with a mass flow controller (MFC) 15b and an opening/closing valve V2 in sequence from the upstream side. The processing gas for plasma etching is supplied from the processing gas source 15 into the gas diffusion space 16c through the gas supply line 15a. The processing gas is supplied from this gas diffusion space 16c into the processing vessel 1 through the gas through holes 16d and the gas discharge holes 16e while being distributed in the shower shape.

The shower head 16 is electrically connected with a variable DC power supply 72 via a low pass filter (LPF) 71. This variable DC power supply 72 is configured to turn on/off a power feed by an on/off switch 73. A current/voltage of the variable DC power supply 72 and an on/off operation of the on/off switch 73 are controlled by a controller 90 to be described later. Further, when plasma is formed in the processing space as the high frequency powers from the first RF power supply 10a and the second RF power supply 10b are applied to the placing table 2, the on/off switch 73 is turned on by the controller 90 when necessary, and a preset DC voltage is applied to the shower head 16.

A cylindrical grounding conductor 1a extends upwards from a sidewall of the processing vessel 1 to be higher than a height position of the shower head 16. This cylindrical grounding conductor 1a has a ceiling wall at a top portion thereof.

An exhaust port 81 is formed at a bottom of the processing vessel 1. The exhaust port 81 is connected with an exhaust device 83 via an exhaust line 82. The exhaust device 83 has a vacuum pump. The exhaust device 83 is configured to decompress the inside of the processing vessel 1 to a preset vacuum level by operating the vacuum pump. Meanwhile, a carry-in/out opening 84 for the wafer 8 is formed at the sidewall of the processing vessel 1. A gate valve 85 configured to open or close the carry-in/out opening 84 is provided at the carry-in/out opening 84.

Inside the processing vessel 1, a deposition shield 86 is provided along an inner wall surface of the sidewall of the processing vessel 1. The deposition shield 86 suppresses an etching byproduct (deposit) from adhering to the processing vessel 1. A conductive member (GND block) 89, which is provided such that a potential thereof with respect to the ground is controllable, is disposed at the deposition shield 86 substantially on a level with the wafer 8. With this configuration, an abnormal discharge is suppressed. Further, a deposition shield 87 extending along the inner wall member 3a is provided at a lower end portion of the deposition shield 86. The deposition shields 86 and 87 are detachably provided.

An overall operation of the plasma processing apparatus 100 having the above-described configuration is controlled by the controller 90. The controller 90 includes a process controller 91 provided with a CPU and configured to control the individual components of the plasma processing apparatus 100; a user interface 92; and a storage 93.

The user interface 92 includes a keyboard through which a process manager inputs commands to manage the plasma processing apparatus 100; a display configured to visually display an operational status of the plasma processing apparatus 100; and so forth.

The storage 93 stores therein control programs (software) for implementing various processings performed in the plasma processing apparatus 100 under the control of the process controller 91; and recipes in which processing condition data or the like are stored. When necessary, a required recipe is retrieved from the storage 93 in response to an instruction from the user interface 92 and executed by the process controller 91, so that a required processing is performed in the plasma processing apparatus 100 under the control of the process controller 91.

[Configuration of Placing Table]

Figure 2:
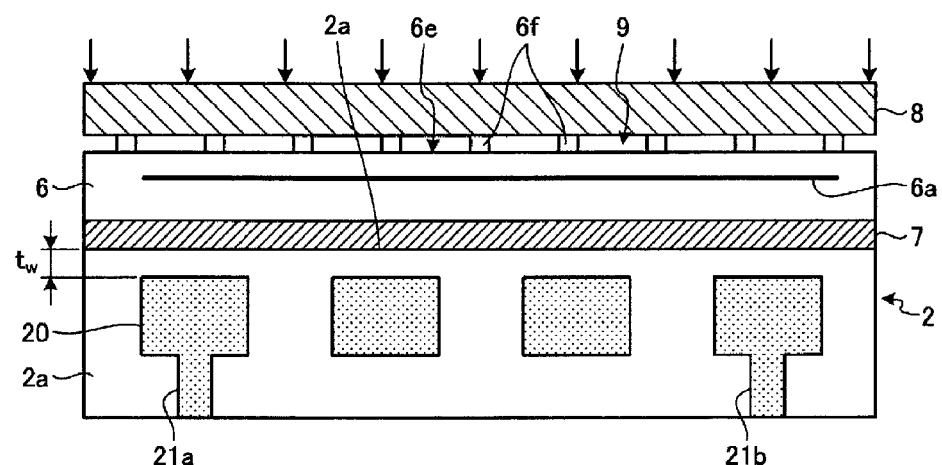
FIG. 2 is a schematic cross sectional view illustrating a configuration example of major components of a placing table according to the exemplary embodiment.

Now, referring to FIG. 2, a configuration of major components of the placing table 2 will be elaborated. FIG. 2 is a schematic cross sectional view illustrating a configuration example of the major components of the placing table 2 according to the exemplary embodiment.

The placing table 2 includes the base 2a and the electrostatic chuck 6. The electrostatic chuck 6 has a circular plate shape. Further, the electrostatic chuck 6 is fixed to the base 2a by an adhesive layer 7 such that the electrostatic chuck 6 is arranged coaxially with the base 2a. The top surface of the electrostatic chuck 6 is configured as the placing surface 6e on which the wafer 8 is placed. Protrusions 6f are formed at the placing surface 6e. The wafer 8 is placed on the placing surface 6e. Due to the presence of the protrusions 6f, a space 9 is formed between the placing surface 6e and the wafer 8. The heat transfer gas such as the helium gas is supplied into the space 9. When a plasma processing is performed in the plasma processing apparatus 100, heat from the plasma is inputted to the placing table 2 through the wafer 8 and the space 9.

Within the base 2a, the flow path 20 is provided along the placing surface 6e. The plasma processing apparatus 100 is configured to control a temperature of the placing table 2 by allowing the coolant to flow in the flow path 20.

[Configuration of Flow Path]

Figure 3:
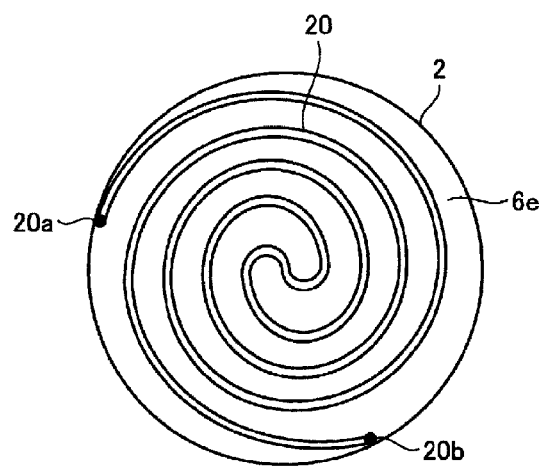
FIG. 3 is a plan view illustrating a configuration example of the placing table according to the exemplary embodiment, seen from the top.

Now, a configuration of the flow path 20 of the placing table 2 will be explained. FIG. 3 is a plan view illustrating an example configuration of the placing table 2 according to the exemplary embodiment, seen from the top. In FIG. 3, the placing surface 6e of the placing table 2 is illustrated to have a circular plate shape. The flow path 20 is formed in a spiral shape in a region within the base 2a corresponding to the placing surface 6e, as illustrated in FIG. 3, for example. The flow path 20 has, at one end thereof, an inlet opening 20a through which the coolant is introduced, and, at the other end, an outlet opening 20b through which the coolant is discharged. The inlet opening 20a is connected with the coolant inlet line 21a. The outlet opening 20b is connected with the coolant outlet line 21b. The coolant introduced into the inlet opening 20a from the coolant inlet line 21a passes through the inside of the flow path 20, and the coolant having passed through the inside of the flow path 20 is then discharged into the coolant outlet line 21b from the outlet opening 20b. Accordingly, in the plasma processing apparatus 100, the temperature of the wafer 8 is controlled on the entire placing surface 6e of the placing table 2.

Figure 4A:
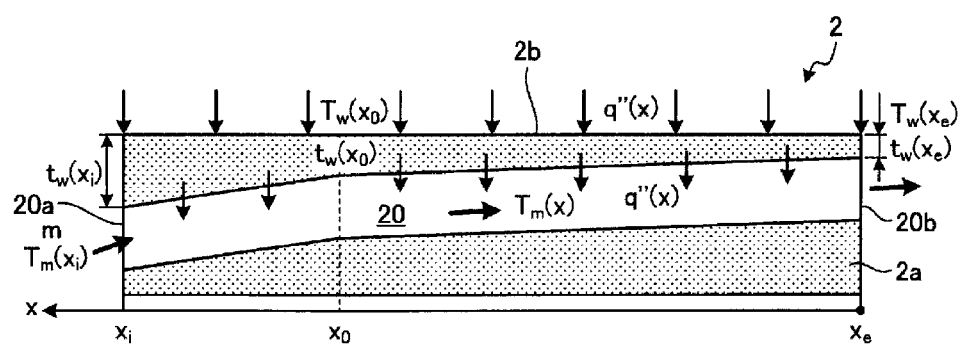
FIG. 4A and FIG. 4B are schematic cross sectional views illustrating a configuration example of a flow path of the placing table according to the exemplary embodiment.
Figure 4B:
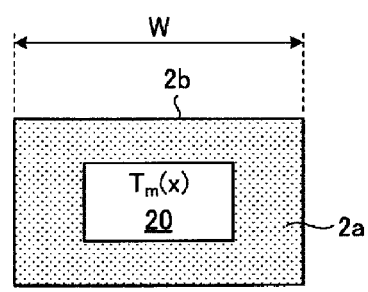

FIG. 4A and FIG. 4B are schematic cross sectional views illustrating a configuration example of the flow path 20 of the placing table 2 according to the exemplary embodiment. FIG. 4A schematically illustrates a cross section of the base 2a taken along the flow path 20. FIG. 4B schematically illustrates a cross section of the base 2a on a plane perpendicular to a flow of the coolant. In FIG. 4A, a horizontal coordinate axis x is shown along the flow path 20. In the following, a position of the flow path 20 will be explained by using a position on the coordinate axis x. A position of the inlet opening 20a of the flow path 20 is referred to as a position $x_i$. A position of the outlet opening 20b of the flow path 20 is referred to as a position $x_e$. A boundary between a thermal entrance region and a thermally fully developed region to be described later is referred to as a position $x_0$. A thickness between an inner wall at a top portion of the flow path 20 and a top surface 2b at a position x of the flow path 20 is referred to as a thickness $t_w(x)$. A temperature of the coolant at the position x is referred to as a temperature $T_m(x)$. A temperature of the top surface 2b at the position x is referred to as a temperature $T_w(x)$. A heat flux inputted from the plasma at the position x is referred to as q"(x). Further, when it is assumed that the plasma has a uniform distribution, the heat flux q"(x) of the plasma may be regarded as a constant value q".

The top surface 2b of the base 2a is formed as a flat surface. The flow path 20 is formed along the top surface 2b within the base 2a. One end of the flow path 20 serves as the inlet opening 20a through which the coolant is introduced, and the other end thereof serves as the outlet opening 20b through which the coolant is discharged. The flow path 20 is formed to have a rectangular cross sectional shape, as illustrated in FIG. 4B, and has the same cross sectional shape from the inlet opening 20a to the outlet opening 20b.

The flow path 20 is formed such that a thermal resistance between the flow path 20 and the top surface 2b is increased as it goes from the outlet opening 20b toward the inlet opening 20a. In the present exemplary embodiment, by changing the thickness $t_w(x)$ between the inner wall at the top portion of the flow path 20 and the top surface 2b, the thermal resistance between the flow path 20 and the placing surface 6e is changed. In the present exemplary embodiment, the flow path 20 is formed such that the thickness $t_w(x)$ is increased as it goes from the outlet opening 20b toward the inlet opening 20a.

Figure 5A:
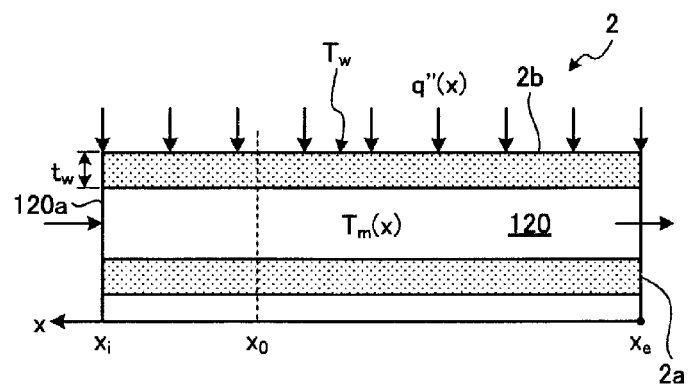
FIG. 5A and FIG. 5B are schematic cross sectional views illustrating a configuration of a flow path of a placing table according to a comparative example.
Figure 5B:
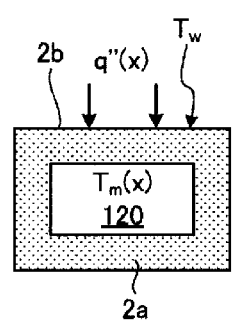

Here, a configuration of a flow path 120 according to a comparative example will be described. FIG. 5A and FIG. 5B are schematic cross sectional views illustrating the configuration of the flow path 120 of the placing table 2 according to the comparative example. FIG. 5A schematically illustrates a cross section of the base 2a taken along the flow path 120. FIG. 5B schematically illustrates a cross section of the base 2a on a plane perpendicular to a flow of the coolant. In the comparative example, the flow path 120 is formed in the base 2a such that the thickness $t_w$ from the top surface 2b is uniform.

In the plasma processing apparatus 100, the heat from the plasma is transferred to the coolant in the flow path 120 through the wafer 8 and the placing table 2, and a temperature of the coolant increases along the flow path 120. Accordingly, a temperature of the top surface 2b of the base 2a increases along the flow path 120. As a result, a temperature difference is generated within the placing surface 6e of the placing table 2, which results in a temperature difference within a surface of the wafer 8 placed on the placing table 2.

Figure 6:
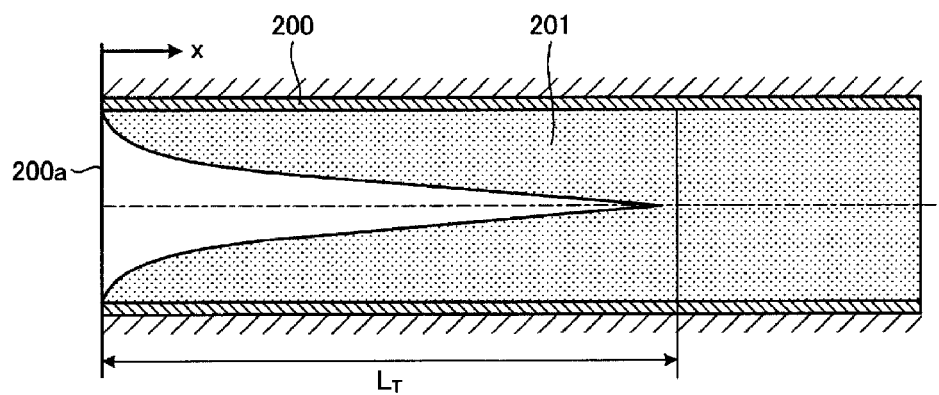
FIG. 6 is a diagram for describing a thermal entrance region and a thermally fully developed region when a coolant is flown in the flow path.

Further, when the coolant is flown into the flow path 120, a thermal entrance region and a thermally fully developed region are formed in the coolant in a range where there is a heat input. The thermal entrance region is a section where a thermal boundary layer is not developed and is formed at an upstream side. The thermally fully developed region is a section where the thermal boundary layer is developed and is formed after the thermal entrance region. FIG. 6 is a diagram for describing the thermal entrance region and the thermally fully developed region when the coolant is flown into the flow path. FIG. 6 illustrates a case where the coolant is flown into a pipe 200, which is a model of the flow paths 20 and 120, from an inlet opening 200a as one end thereof. When there is a heat input to the pipe 200 from the vicinity thereof, the coolant flowing in the pipe 200 becomes to have a thermal boundary layer 201 formed along an inner wall of the pipe 200. The thermal boundary layer 201 is gradually developed toward a center of the pipe 200 as it goes down the pipe 200 from the inlet opening 200a and is merged at the center of the pipe 200. A section $L_T$ from the inlet opening 200a to a position where the thermal boundary layer 201 is merged is the thermal entrance region. The thermally fully developed region in which the flow of the coolant is developed is formed after the thermal entrance region. A heat transfer coefficient of the coolant in the thermal entrance region is higher than that in the thermally fully developed region.

Reference is made back to FIG. 5A and FIG. 5B. When the coolant is flown into the flow path 120, the thermal entrance region is formed near the inlet opening 120a, and the thermally fully developed region is formed after the thermal entrance region in the coolant. A boundary between the thermal entrance region and the thermally fully developed region is referred to as a position $x_0$. The temperature $T_m(x)$ of the coolant increases along the flow path 120, and the temperature $T_w(x)$ of the top surface 2b of the base 2a also increases along the flow path 120.

Figure 7:
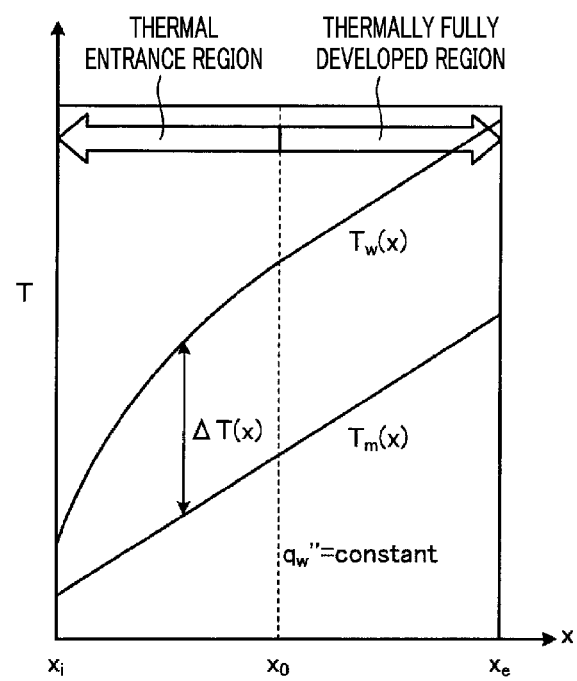
FIG. 7 is a diagram illustrating an example temperature variation along the flow path of the placing table according to the comparative example.

FIG. 7 is a diagram illustrating an example of a temperature variation along the flow path 120 of the placing table 2 according to the comparative example. A horizontal axis of FIG. 7 indicates a position x along the flow path 120, and a vertical axis represents a temperature T. A section from the position $x_i$ to the position $x_0$ is the thermal entrance region. A section from the position $x_0$ to the position $x_e$ is the thermally fully developed region. The temperature $T_m(x)$ of the coolant increases as it goes from the position $x_i$ to the position $x_e$, and the temperature $T_w(x)$ of the top surface 2b of the base 2a also increases. The heat transfer coefficient in this thermal entrance region is higher than that in the thermally fully developed region. Accordingly, the temperature $T_w(x)$ of the top surface 2b of the base 2a becomes lower near the inlet opening 120a of the flow path 120.

If the coolant is flown into the flow path 20 (120), the thermal entrance region is formed in the coolant as a physical phenomenon. For the reason, it is difficult to form a flow path having a uniform heat transfer coefficient. Thus, if the flow path 120 is formed in the base 2a to have a uniform thickness $t_w$ from the top surface 2b, as shown in FIG. 5A and FIG. 5B, the temperature of the wafer 8 increases along the positions $x_i$ to the position $x_e$ of the flow path 120 in which the coolant flows. Further, since the thermal entrance region having the high heat transfer coefficient is formed near the inlet opening 120a of the flow path 120, a cold spot is generated.

In view of the foregoing, in the plasma processing apparatus 100 according to the present exemplary embodiment, the flow path 20 is formed such that the thickness $t_w(x)$ from the top surface 2b is increased toward the inlet opening 20a from the outlet opening 20b, as depicted in FIG. 4A.

Now, an example design method for the flow path 20 according to the exemplary embodiment will be explained. A temperature rise $\Delta T_m$ of the coolant when the coolant passes through the flow path 20 is represented by the following expression 1-1. Further, in the temperature rise $\Delta T_m$ of the coolant, a relationship represented by the following expression 1-2 is established between a mass flow rate m of the coolant and a specific heat Cp of the coolant.

[Expression 1]

$$\Delta T_m = T_m(x_e) - T_m(x_i) \qquad (1\text{-}1)$$

$$\Delta T_m = \frac{q}{mC_p} \qquad (1\text{-}2)$$

Here, $T_m(x_i)$ denotes a temperature [° C.] or [K] of the coolant at the position $x_i$; $T_m(x_e)$, a temperature [° C.] or [K] of the coolant at the position $x_e$; m, the mass flow rate [kg/s] of the coolant; $C_p$, the specific heat [J/kg·K] of the coolant; and q, a heat amount [W] inputted from the plasma.

From the expressions 1-1 and 1-2, the mass flow rate m of the coolant can be represented by the following expression 2. Thus, by using the expression 2, the mass flow rate m of the coolant can be calculated from the heat amount q inputted from the plasma and the temperature rise $\Delta T_m$ of the coolant.

[Expression 2]

$$m = \frac{q}{C_p \Delta T_m} \qquad (2)$$

In case of designing the thickness $t_w(x)$ from the top surface 2b at the position x of the flow path 20, a thickness from the top surface 2b at a position of an end of the flow path 20 is first decided. Then, a thickness from the top surface 2b is decided from the end of the flow path 20 by using a thickness at the position of the end of the flow path 20 as a reference. In the present exemplary embodiment, a thickness $t_w(x_e)$ from the top surface 2b at the outlet opening 20b of the flow path 20 is first decided. By way of example, the thickness $t_w(x_e)$ can be calculated from the following expression 3. Further, in the expression 3, a heat flux of the plasma is set as a constant value q".

[Expression 3]

$$t_W(x_e) = \left(\frac{T_W(x_e) - T_m(x_e)}{q''} - \frac{1}{h(x_e)}\right)k_W(x_e) \qquad (3)$$

Here, $t_W(x_e)$ denotes the thickness from the top surface 2b at the position $x_e$ of the flow path 20; $T_W(x_e)$, a temperature [° C.] or [K] of the top surface 2b at the position $x_e$ of the flow path 20; $T_m(x_e)$, the temperature [° C.] or [K] of the coolant at the position $x_e$; q'', the heat flux [W/m²] inputted from the plasma; h(x), a heat transfer coefficient [W/m²·K] of the flow path 20 at the position x; $h(x_e)$, the heat transfer coefficient [W/m²·K] of the flow path 20 at the position $x_e$; $k_W(x)$, the thermal conductivity [W/m·K] of the base 2a at the position x; and $k_W(x_e)$, the thermal conductivity [W/m·K] of the base 2a at the position $x_e$.

By way of example, the thickness $t_w(x_e)$ is calculated from the temperature $T_w(x_e)$ of the top surface 2b, the temperature $T_m(x_e)$ of the coolant, the heat transfer coefficient $h(x_e)$ and the thermal conductivity $k_w(x_e)$ of the base 2a and the heat flux q'' at the position $x_e$ of the outlet opening 20b by using the expression 3.

Then, the thermal entrance region (ranging from the positions $x_0$ to $x_i$) and the thermally fully developed region (ranging from the positions $x_0$ to $x_e$) of the flow path 20 are calculated from a flowing state of the coolant. The coolant flows as a laminar flow or a turbulent flow within the flow path 20 depending on the Reynold's number Re thereof. The Reynold's number Re is calculated from the following expression 4.

[Expression 4]

$$Re = \frac{\rho u_m D_H}{\mu} = \frac{\rho u_m A D_H}{\mu A} = \frac{m}{\mu A / D_H} \qquad (4)$$

Here, ρ denotes a density [kg/m³] of the coolant; $u_m$, an average flow velocity [m/s] of the coolant; μ, a viscosity [Pa·s] of the coolant; A, a cross sectional area [m²] of the flow path 20; $D_H$, a hydraulic diameter of the flow path 20 ($D_H$=4A/$P_{wet}$); and $P_{wet}$, a wetted perimeter [m] of the flow path 20 (for example, a length of a wall surface in contact with the coolant on a cross section of the flow path 20 along a plane perpendicular to the flow of the coolant).

Theoretically, a length $\Delta x_{0i}$ of the thermal entrance region of the flow path 20 is represented by the following expressions 5-1 and 5-2 according to the Reynold's number Re of the coolant.

[Expression 5]

laminar flow region(Re≤2300):$\Delta x_{0i} = x_i - x_0 \approx 0.05$ RePr·$D_H$ \qquad (5-1)

turbulent flow region(Re>2300):$\Delta x_{0i} = x_i - x_0 \approx 10 D_H$ \qquad (5-2)

Here, Pr denotes a Prandtl number of the coolant; and $\Delta x_{0i}$, the length [m] of the thermal entrance region of the flow path 20.

Actually, in case that the coolant flows as the turbulent flow, the length $\Delta x_{0i}$ of the thermal entrance region is in a range from twice the hydraulic diameter $D_H$ of the flow path 20 to 10 times the hydraulic pressure $D_H$. In case that the flow of the coolant is the turbulent flow, the thermal entrance region is set to be a range from the position $x_i$ of the inlet opening 20a to the position $x_0$ where the length of the thermal entrance region falls within the range from the twice the hydraulic diameter $D_H$ of the flow path 20 to 10 times the hydraulic pressure $D_H$. Further, in case that the flow of the coolant is the laminar flow, the thermal entrance region is decided to be a range from the position $x_i$ of the inlet opening 20a to the position $x_0$ where the length of the thermal entrance region becomes the length of the expression 5-1. The thermally fully developed region is decided to be a range from the position $x_0$ after the thermal entrance region of the flow path 20 to the position $x_e$.

Thereafter, for the thermal entrance region (ranging from the positions $x_0$ to $x_i$) and the thermally fully developed region (ranging from the positions $x_0$ to $x_e$) of the flow path 20, a thickness from the top surface 2b at each position of the flow path 20 is decided such that the thickness from the top surface 2b increases toward the inlet opening 20a from the outlet opening 20b.

For the thermally fully developed region, the thickness $t_w(x)$ from the top surface 2b at the position x of the flow path 20 can be calculated from the following expression 6 by using the thickness $t_w(x_e)$ at the position $x_e$ as a reference.

[Expression 6]

$$t_W(x) = t_W(x_e) + \left(\frac{W|x - x_e|}{mC_p}\right)k_W \qquad (6)$$

By way of example, the thickness $t_w(x_0)$ at the position $x_0$ as the boundary between the thermal entrance region and the thermally fully developed region is calculated from the following expression 7 based on the expression 6.

[Expression 7]

$$t_W(x_0) = t_W(x_e) - \left(\frac{W(x_0 - x_e)}{mC_p}\right)k_W \qquad (7)$$

For example, for the thermally fully developed region (ranging from the positions $x_0$ to $x_e$), the thickness $t_w(x)$ at the position x of the flow path 20 is decided to be linearly increased from the thickness $t_w(x_e)$ at the position $x_e$ shown in the expression 6 to the thickness $t_w(x_0)$ at the position $x_0$ shown in the expression 7.

For the thermal entrance region, the thickness $t_w(x)$ at the position x of the flow path 20 can be calculated from the following expression 8 by using the thickness $t_w(x_e)$ at the position $x_e$ as a reference.

[Expression 8]

$$t_W(x) = t_W(x_e) + \left(\frac{W|x - x_e|}{mC_p} + \frac{1}{h(x)} - \frac{1}{h(x_e)}\right)k_W \qquad (8)$$

In the thermally fully developed region, the heat transfer coefficient h(x) becomes a constant value h. The heat transfer coefficient h of the thermally fully developed region can be calculated from the following expression 9, for example.

[Expression 9]

$$h = 0.023 \mathrm{Re}^{0.8} Pr^{0.4} \left(\frac{k}{D_H}\right) \quad (9)$$

Here, Pr denotes the Prandtl number of the coolant; $D_H$, the hydraulic diameter of the flow path 20; and k, a thermal conductivity [W/m·K] of the coolant.

The heat transfer coefficient h(x) of the thermal entrance region (ranging from the positions $x_0$ to $x_i$) varies from $h(x_i)$ to h. Theoretically, though the heat transfer coefficient $h(x_i)$ is infinite ($h(x_i)=\infty$), it needs to be appropriately estimated as the thickness near the inlet opening 20a is large and thermal diffusion in a transversal direction is not negligible. In a region where the flow of the coolant becomes the turbulent flow, the thickness $t_w(x)$ of the flow path can be calculated from the expression 8, assuming that $h(x_i)$ is in a range from 1.1 h to 2.0 h.

In the region where the flow of the coolant becomes the turbulent flow, the thermal entrance region is very short. Thus, in the region where the flow of the coolant is the turbulent flow, the thickness $t_w(x)$ at the position x in the thermal entrance region is decided to be linearly increased from the thickness $t_w(x_i)$ at the position $X_i$ to the thickness $t_w(x_0)$ at the position $x_0$.

In the above-described design method according to the present exemplary embodiment, if the flow path 20 is designed by assuming a maximum heat input from the plasma, higher temperature uniformity can be obtained with respect to a heat input smaller than the maximum heat input.

In case that the base 2a is made of a material such as titanium or stainless steel having a low thermal conductivity, the thickness $t_w(x_i)$ at the inlet opening 20a is not greatly increased as compared to the thickness $t_w(x_e)$ at the outlet opening 20b. Meanwhile, if the base 2a is made of a material such as alumina having a high thermal conductivity, the thickness $t_w(x_i)$ at the inlet opening 20a is largely increased as compared to the thickness $t_w(x_e)$ at the outlet opening 20b. In such a case, a material such as stainless steel, titanium or alumina ceramic having a low thermal conductivity or a thermally sprayed film may be provided at a ceiling of the flow path 20.

Besides the electrostatic chuck 6, in case that a top surface and a bottom surface of the flow path 20 or four surfaces thereof receive heat, a temperature of an outer wall of the flow path 20 can be uniformed along the flow path 20 when the thickness of the outer wall around the flow path 20 is designed according to the design method of the present exemplary embodiment. Furthermore, in case that the flow path 20 has a circular or another cross sectional shape, when a thickness of a wall of a heat receiving surface is designed according to the design method of the present exemplary embodiment, the temperature of the outer wall of the flow path ranging from the inlet opening 20a to the outlet opening 20b can be uniformed along the flow path 20.

Now, a specific configuration example of the flow path 20 will be explained. In the flow path 20 shown in FIG. 4A and FIG. 4B, a width and a height of the flow path 20 are set to be 12 mm; a length (ranging from the positions $x_i$ to $x_e$) of the flow path 20 is set to be 4.5 m; and a width W of a heated surface which receives the heat inputted to the flow path 20 from the plasma is set to be 22 mm. Further, the heat amount inputted from the plasma is set to be 4950 [W], and the heat flux from the plasma is set to be 50000 [W/m²]. The temperature rise $\Delta T_m$ of the coolant is set to be 5.84° C.

Novec 7200 produced by 3M is used as the coolant, and the mass flow rate m of the coolant is set to be 0.821 [kg/s]. The base 2a is made of titanium. The thickness $t_w(x_e)$ of the outlet opening 20b is set to be 1 mm. The length of the thermal entrance region (ranging from the positions $x_0$ to $x_i$) is set to be $3 \cdot D_H = 36$ mm. The position $x_i$ of the inlet opening 20a is set to be a position of x=0 mm, and the position $x_e$ of the outlet opening 20b is set to be a position of x=4500 mm. The position $x_0$ which is the boundary between the thermal entrance region and the thermally fully developed region is set to be a position of x=36 mm, which is located at an upstream of the position $x_e$ of the outlet opening 20b by 4464 mm (4500 mm−36 mm).

If the above-stated design method according to the present exemplary embodiment is used, the thickness $t_w(x_0)$ at the position $x_0$ is calculated to be 3.50 mm. Further, the thickness $t_w(x_i)$ at the position $x_i$ is calculated to be 6.04 mm.

In the placing table 2 according to the present exemplary embodiment, the flow path 20 is formed such that the thickness $t_w(x)$ from the top surface 2b increases toward the inlet opening 20a from the outlet opening 20b. By way of example, the flow path 20 is formed such that the thickness $t_w(x)$ is linearly increased from 1 mm to 3.50 mm in the range from the position $x_e$ to the position $x_0$ (x=4500 mm to 36 mm). Further, the flow path 20 is formed such that the thickness $t_w(x)$ is linearly increased from 3.50 mm to 6.04 mm in the range from the position $x_0$ to the position $x_i$ (x=36 mm to 0 mm).

A ceramic plate is attached to the placing table 2 in which this flow path 20 is formed, and a simulation of cooling the wafer 8 by using the helium gas is performed. The heat amount inputted from the plasma is set to be 4950 [W], and the heat flux from the plasma is set to be 50000 [W/m²]. Further, as a comparative example, the same simulation is conducted for a case where the thickness $t_w$ from the top surface 2b is set to be uniform, as illustrated in FIG. 5A and FIG. 5B.

Figure 8:
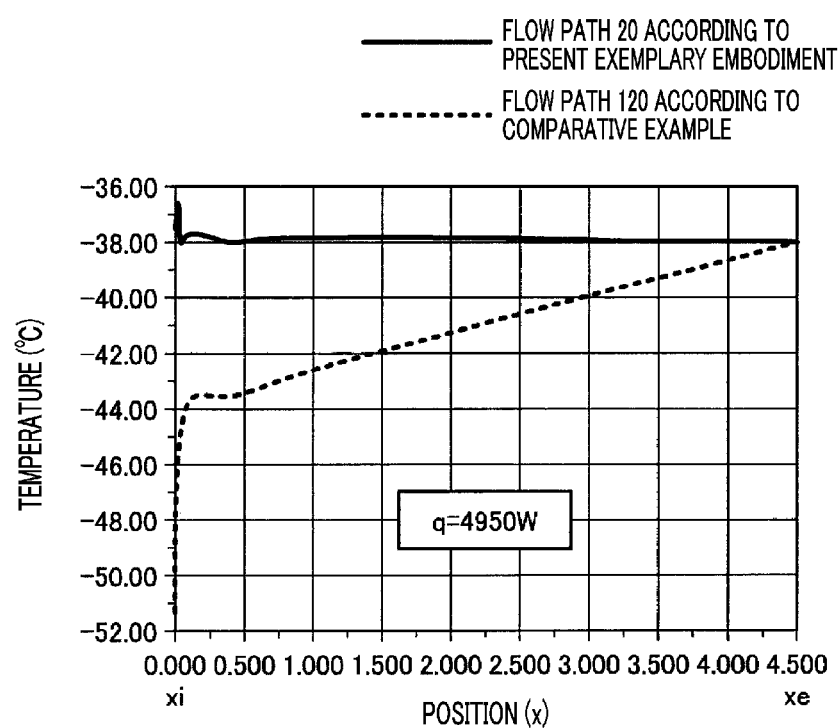
FIG. 8 is a diagram illustrating an example simulation result according to the exemplary embodiment.

FIG. 8 is a diagram illustrating an example simulation result according to the exemplary embodiment. A horizontal axis of FIG. 8 represents the position x from the inlet opening 20a, and a vertical axis indicates the temperature of the top surface of the placing table 2. In the flow path 120 according to the comparative example, the temperature of the top surface of the placing table 2 increases in the range from the positions $x_i$ to $x_e$. Accordingly, there is generated the temperature difference within the placing surface 6e of the placing table 2, which results in the temperature difference within the surface of the wafer 8 placed thereon.

Meanwhile, in the flow path 20 according to the present exemplary embodiment, the temperature of the top surface of the placing table 2 can be uniformed approximately. Accordingly, the temperature of the wafer 8 placed on the placing table 2 can be uniformed approximately, so that the temperature difference within the surface of the wafer 8 can be reduced.

Further, by setting the heat amount inputted from the plasma to be 2475 [W], that is, a half of 4950 [W], the same simulation is conducted for the placing table 2 in which the flow path 20 according to the present exemplary embodiment is formed and for the placing table 2 in which the flow path 120 according to the comparative example is formed.

Figure 9:
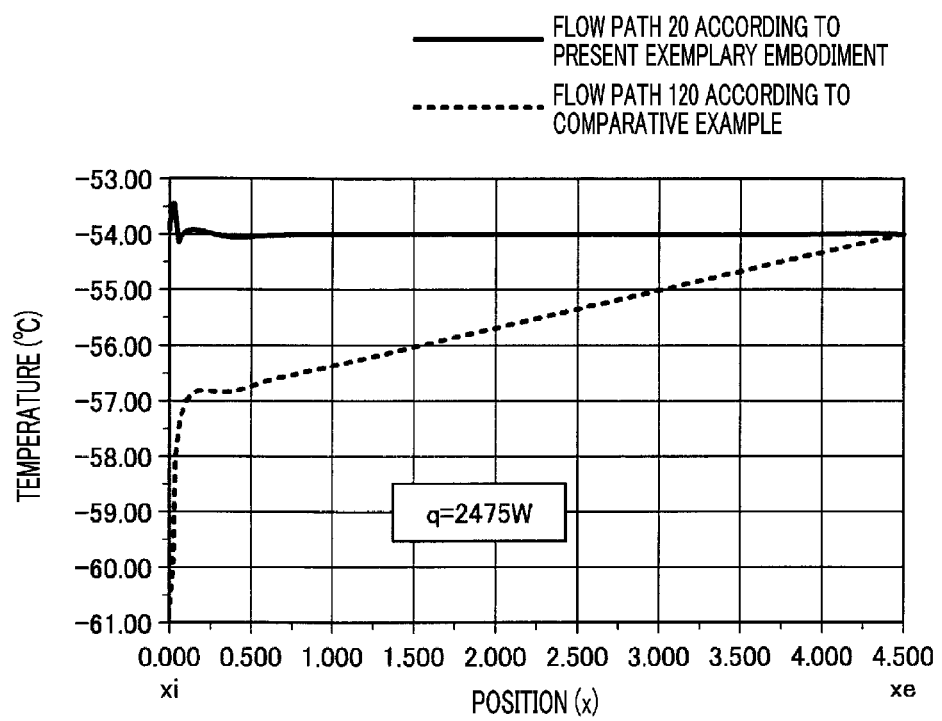
FIG. 9 is a diagram illustrating another example simulation result according to the exemplary embodiment.

FIG. 9 is a diagram illustrating another example simulation result according to the exemplary embodiment. A horizontal axis of FIG. 9 represents the position x from the inlet opening 20a, and a vertical axis indicates the temperature of the top surface of the placing table 2. Even in case that the heat amount inputted from the plasma is set to be the half of the heat amount in the previous simulation, the temperature of the top surface of the placing table 2 can be uniformed approximately in the flow path 20 according to the present exemplary embodiment. Meanwhile, in the flow path 120 according to the comparative example, the temperature of the top surface of the placing table 2 is found to increase along the flow path 120.

As stated above, in the placing table 2 in which the flow path 20 according to the present exemplary embodiment is formed, the temperature difference within the surface of the wafer 8 placed thereon can be reduced.

Here, in the above-described configuration of the placing table 2, by changing the thickness between the inner wall at the top portion of the flow path 20 and the top surface 2b, the thermal resistance between the flow path 20 and the placing surface 6e is changed. However, the thermal resistance between the flow path 20 and the placing surface 6e may be changed by varying a thickness or a material of a member between the flow path 20 and the placing surface 6e.

Figure 10:
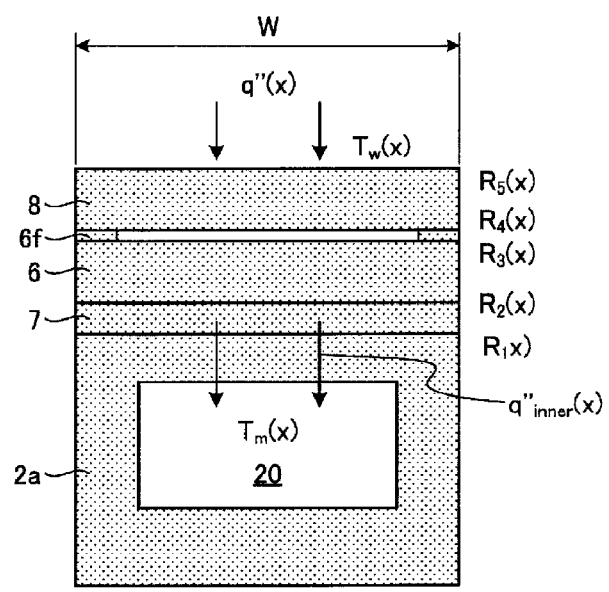
FIG. 10 is a diagram for describing a thermal resistance of the placing table according to the exemplary embodiment.

The thermal resistance of the placing table 2 will be explained. FIG. 10 is a diagram for describing the thermal resistance of the placing table 2 according to the exemplary embodiment. FIG. 10 shows a cross section of the placing table 2 taken along a plane perpendicular to the flow of the coolant at the position x.

The placing table 2 is composed of a multiple number of members such as the base 2a, the adhesive layer 7 and the electrostatic chuck 6 stacked on top of each other. The wafer 8 is placed on the electrostatic chuck 6. In FIG. 10, a thermal resistance between the flow path 20 and the top surface 2b of the base 2a at the position x is indicted as a thermal resistance $R_1(x)$. Further, a thermal resistance of the adhesive layer 7 at the position x is indicated as a thermal resistance $R_2(x)$. Further, a thermal resistance of the electrostatic chuck 6 at the position x is indicated as a thermal resistance $R_3(x)$. A thermal resistance between the electrostatic chuck 6 and the wafer 8 at the position x is indicated as a thermal resistance $R_4(x)$. Further, a thermal resistance of the wafer 8 at the position x is indicated as a thermal resistance $R_5(x)$. Further, in FIG. 10, the heat flux q"(x) from the plasma at the position x and the temperature $T_w(x)$ of the wafer 8 at the position x are shown. Furthermore, the temperature $T_m(x)$ of the coolant at the position x is shown, and a heat flux $q''_{inner}(x)$ inputted to the coolant at the position x is also shown.

In a thermal equilibrium state where the temperature of the wafer 8 and the placing table 2 are maintained constant by the heat input from the plasma and the cooling by the coolant, the heat amount inputted from the plasma and the heat amount radiated by the coolant becomes substantially equal. That is, a condition of $q''(x) \approx q''_{inner}(x)$ is satisfied. Further, when the temperature of the wafer 8 is uniform, the temperature $T_w(x)$ of the wafer 8 at the position x is equal to the temperature at the position $x_e$, so that a condition of $T_w(x)=T_w(x_e)=T_w$ is obtained.

The thermal resistance between the wafer 8 and the flow path 20 at the position x is a sum of thermal resistances $R_n$ of the individual members between the wafer 8 and the flow path 20, and is indicated by the following expression 10. By way of example, in FIG. 10, the thermal resistance between the wafer 8 and the flow path 20 at the position x is a sum of the thermal resistances $R_1$ to $R_5$ (n=5).

[Expression 10]

$$\sum_{i=1}^{n} R_i(x) \qquad (10)$$

The temperature $T_m(x)$ of the coolant at the position x may be represented by the following expression 11.

[Expression 11]

$$T_m(x) = T_m(x_i) + \frac{1}{mC_p} \int_{x=x_i}^{x} Wq''(x)dx \qquad (11)$$

Here, $T_m(x_i)$ denotes a temperature [° C. or K] of the coolant at the position $x_i$; and W, a width [m] of the heated surface which receives the heat inputted to the flow path 20 from the plasma. By way of example, when the flow path 20 is formed to have a spiral shape at a regular distance, W is set to be a width between middle points of two adjacent portions of the flow path 20.

The thermal resistance between the wafer 8 and the flow path 20 at the position $x_e$ of the outlet opening 20b may be represented by the following expression 12.

[Expression 12]

$$\sum_{i=1}^{n} R_i(x_e) = \frac{T_W - T_m(x_e)}{q''(x_e)} - \frac{1}{h(x_e)} \qquad (12)$$

Here, $T_w$ denotes a temperature [° C. or K] of the wafer 8; $T_m(x_e)$, a temperature [° C. or K] of the coolant at the position $x_e$; q"($x_e$), a heat flux [W/m²] from the plasma at the position $x_e$; and h($x_e$), a heat transfer coefficient [W/m²·K] of the flow path at the position $x_e$.

In the thermally fully developed region, the heat transfer coefficient h(x) becomes a constant value $h_\infty$. Accordingly, in the thermally fully developed region, the thermal resistance between the wafer 8 and the flow path 20 at the position x needs to satisfy the following expression 13.

[Expression 13]

$$\sum_{i=1}^{n} R_i(x) = \frac{T_W - T_m(x)}{q''(x)} - \frac{1}{h_\infty} \qquad (13)$$

Meanwhile, in the thermal entrance region of the flow path 20 or in a region thereof where the heat transfer coefficient h(x) varies, the thermal resistance between the wafer 8 and the flow path 20 at the position x needs to satisfy the following expression 14.

[Expression 14]

$$\sum_{i=1}^{n} R_i(x) = \frac{T_W - T_m(x)}{q''(x)} - \frac{1}{h(x)} \qquad (14)$$

When the heat flux q"(x) from the plasma has a distribution, the aforementioned expressions 11 to 14 are used.

Meanwhile, when the heat flux q"(x) from the plasma is a constant value q", the thermal resistance between the wafer 8 and the flow path 20 at the position $x_e$ of the outlet opening 20b, which is represented by the expression 12, becomes the following expression 15.

[Expression 15]

$$\sum_{i=1}^{n} R_i(x_e) = \frac{T_W - T_m(x_e)}{q''} - \frac{1}{h(x_e)} \quad (15)$$

Further, when the heat flux q"(x) from the plasma becomes the constant value q", the thermal resistance between the wafer 8 and the flow path 20 at the position x, which is represented by the expression 13, becomes the following expression 16.

[Expression 16]

$$\sum_{i=1}^{n} R_i(x) = \frac{|x_e - x| \cdot W}{mC_p} + \sum_{i=1}^{n} R_i(x_e) \quad (16)$$

The second item on the right-hand side of the expression 16 is the left-hand side of the expression 15. Accordingly, in the thermally fully developed region, the thermal resistance between the wafer 8 and the flow path 20 at the position x increases according to a distance ($|x_e-x|$) from the position $x_e$ of the outlet opening 20b of the flow path 20.

Further, when the heat flux q"(x) from the plasma becomes the constant value q", the thermal resistance between the wafer 8 and the flow path 20 at the position x, which is represented by the expression 14, becomes the following expression 17 in the thermal entrance region of the flow path 20 or in the region thereof where the heat transfer coefficient h(x) varies.

[Expression 17]

$$\sum_{i=1}^{n} R_i(x) = \frac{|x_e - x| \cdot W}{mC_p} + \left[\frac{1}{h(x_e)} - \frac{1}{h(x)}\right] + \sum_{i=1}^{n} R_i(x_e) \quad (17)$$

The first item and the third item on the right-hand side of the expression 17 is the right-hand side of the expression 16. Accordingly, in the thermal entrance region of the flow path 20 or in the region thereof where the heat transfer coefficient h(x) varies, the thermal resistance between the wafer 8 and the flow path 20 at the position x is increased larger than that in the thermally fully developed region.

Figure 11:
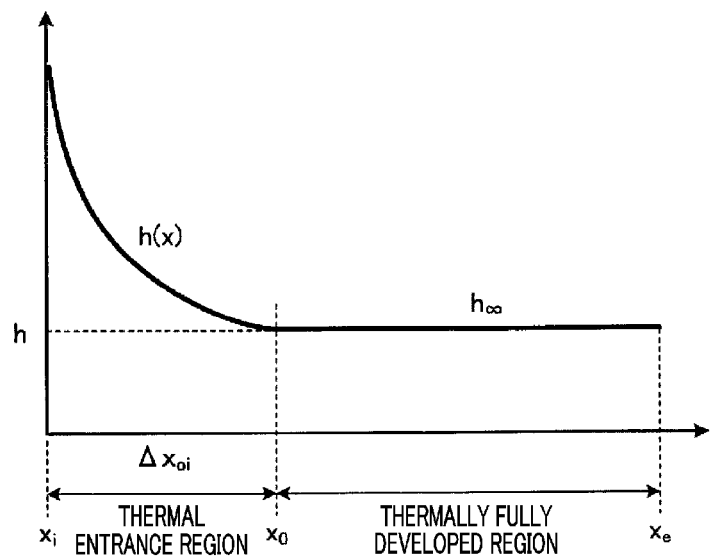
FIG. 11 is a diagram illustrating an example of a variation of a heat transfer coefficient according to the exemplary embodiment.

The heat transfer coefficient h(x) becomes a very large value at the inlet opening 20a, rapidly decreases as the position is distanced away from the inlet opening 20a, and does not change if the position exceeds the thermal entrance region. FIG. 11 is a diagram illustrating an example variation of the heat transfer coefficient according to the exemplary embodiment. A horizontal axis of FIG. 11 indicates the position x along the flow path 20, and a vertical axis thereof represents the heat transfer coefficient. The heat transfer coefficient h(x) becomes the very large value at the position $x_i$ of the inlet opening 20a and becomes $h_\infty$ when the position exceeds the thermal entrance region. The length $\Delta x_{0i}$ of the thermal entrance region becomes as indicated by the expressions 5-1 and 5-2 according to the Reynold's number Re of the coolant.

If the flow of the coolant is the laminar flow, the heat transfer coefficient $h_\infty$ of the thermally fully developed region depends on the cross sectional shape. By way of example, if the cross sectional shape is a circular shape, the heat transfer coefficient $h_\infty$ is calculated from the following expression 18.

[Expression 18]

$$h_\infty = 4.36(k/D_H) \quad (18)$$

Here, k denotes the thermal conductivity [W/m·K] of the coolant, and $D_H$ represents the hydraulic diameter of the flow path 20.

If the cross sectional shape is a shape other than the circular shape, the heat transfer coefficient $h_\infty$ of the thermally fully developed region can be calculated from a handbook in which a calculation method for the heat transfer coefficient is described, an experiment result or a heat flow simulation. Furthermore, in case that the flow of the coolant is the turbulent flow, the heat transfer coefficient $h_\infty$ of the thermally fully developed region can be calculated from the above-described expression 9.

If the flow of the coolant is the laminar flow, the heat transfer coefficient h(x) of the thermal entrance region depends on the cross sectional shape, and can be calculated from a handbook in which a calculation method for the heat transfer coefficient is described, an experiment result or a heat flow simulation. Likewise, in case that the flow of the coolant is the turbulent flow, the heat transfer coefficient h(x) of the thermal entrance region can be calculated from a handbook in which a calculation method for the heat transfer coefficient is described, an experiment result or a heat flow simulation.

By calculating the heat transfer coefficient h(x) of the thermal entrance region and the transfer coefficient $h_\infty$ of the thermally fully developed region and putting the calculated values in the expressions 11 to 17, conditions of the thermal resistances of the individual members between the wafer 8 and the flow path 20 to allow the temperature of the top surface of the placing table 2 to be uniformed approximately can be obtained. By way of example, if thermal resistances $R_2(x)$ to $R_5(x)$ are set in FIG. 10, the thermal resistance $R_1(x)$ between the flow path 20 and the top surface 2b of the base 2a is changed to satisfy the condition. By way of example, by changing the thickness between the inner wall at the top portion of the flow path 20 and the top surface 2b or the material of the base 2a partially, the sum of the thermal resistances $R_1(x)$ to $R_5(x)$ is changed to satisfy the condition. As a result, the flow path 20 is capable of allowing the temperature of the top surface of the placing table 2 to be uniformed approximately. As a consequence, the temperature of the wafer 8 placed on the placing table 2 can be uniformed approximately, so that the temperature difference within the surface of the wafer 8 can be reduced.

As stated above, the placing table 2 according to the present exemplary embodiment includes the base 2a and the flow path 20. Within the base 2a, the flow path 20 is formed along the top surface 2b. One end of the flow path 20 serves as the inlet opening 20a through which the coolant is introduced, and the other end thereof serves as the outlet opening 20b through which the coolant is discharged. The flow path 20 is formed such that the thermal resistance with respect to the top surface 2b is increased as it goes toward the inlet opening 20a from the outlet opening 20b. Accordingly, in the placing table 2, the temperature difference within the top surface 2b can be reduced. As a result, the temperature of the wafer 8 placed on the placing table 2 can be made approximately uniform, so that the temperature difference within the surface of the wafer 8 can be reduced.

Further, in the base 2a according to the present exemplary embodiment, the heat from the plasma is inputted to the top surface 2b. The flow path 20 is formed such that the thermal resistance with respect to the top surface 2b is increased as it goes toward the inlet opening 20a from the outlet opening 20b according to a temperature gradient of the coolant which flows from the inlet opening 20a toward the outlet opening 20b. Accordingly, in the placing table 2, the temperature difference within the top surface 2b can be reduced.

Furthermore, the flow path 20 according to the present exemplary embodiment is formed such that an increment degree of the thermal resistance in the thermal entrance region in which the temperature boundary layer is not developed yet by the coolant introduced from the inlet opening 20a is larger than an increment degree of the thermal resistance in the thermally fully developed region in which the temperature boundary layer is developed. Accordingly, it is possible to suppress the generation of the cold spot in the region of the top surface 2b of the placing table 2 corresponding to the thermal entrance region.

Moreover, the flow path 20 according to the present exemplary embodiment is formed such that the aforementioned expression 13 is satisfied in the thermally fully developed region. Accordingly, the temperature difference in the region of the top surface 2b of the placing table 2 corresponding to the thermally fully developed region can be reduced.

In addition, the flow path 20 according to the present exemplary embodiment is formed such that the aforementioned expression 14 is satisfied in the thermal entrance region. Accordingly, in the placing table 2, the temperature difference in the region of the top surface 2b of the placing table 2 corresponding to the thermal entrance region can be reduced.

Besides, the flow path 20 according to the present exemplary embodiment is formed such that the thickness $t_w(x)$ is increased from the outlet opening 20b toward the inlet opening 20a. By changing the thickness $t_w(x)$, the thermal resistance between the top surface 2b and the flow path 20 can be changed in the placing table 2, so that the temperature difference within the top surface 2b can be reduced.

So far, the exemplary embodiment has been described. It will be appreciated that the exemplary embodiment of the present disclosure is illustrative only and is not intended to be limiting. Various modifications may be made therefrom. Further, the above-described exemplary embodiment may be omitted, substituted or changed in various ways without departing from the scope and spirit of the following claims.

Figure 12:
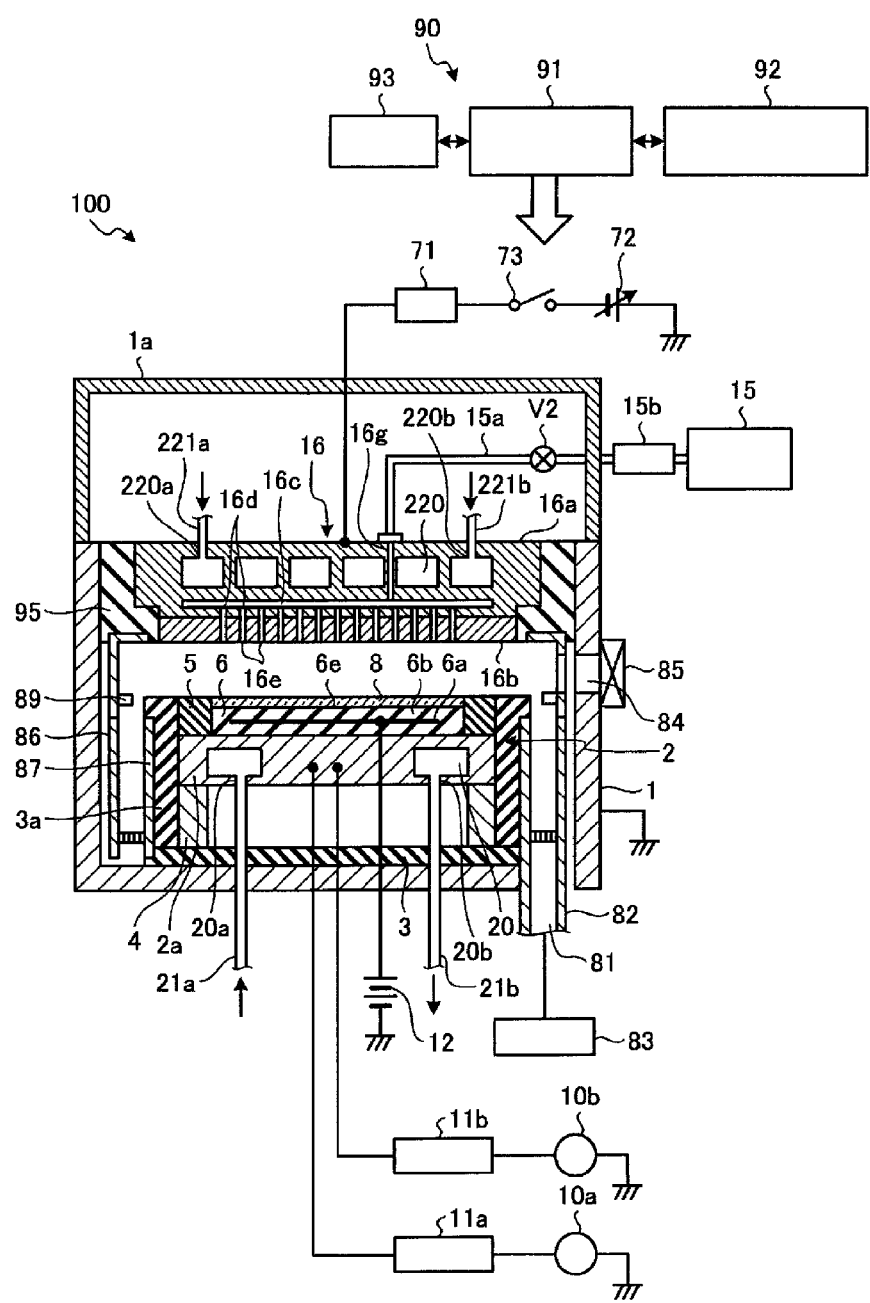
FIG. 12 is a schematic cross sectional view illustrating another example configuration of the plasma processing apparatus according to the exemplary embodiment.

By way of example, the above exemplary embodiment has been described for the example where the placing table 2 is used as the temperature adjusting device and the temperature difference within the surface of the wafer 8 and the placing surface 6e and the temperature difference within the top surface 2b of the base 2a are reduced. However, the exemplary embodiment is not limited thereto and may be applied to another component of the plasma processing apparatus 100. By way of example, in order to cool the upper electrode, the plasma processing apparatus 100 may perform a temperature control by circulating a coolant in a flow path provided in the upper electrode. Further, in order to cool the processing vessel 1 uniformly, the plasma processing apparatus 100 may perform a temperature control by circulating a coolant in a flow path provided in the sidewall of the processing vessel 1. The design method of the exemplary embodiment may be applied to these flow paths for use in the temperature control. FIG. 12 is a schematic cross sectional view illustrating another example configuration of the plasma processing apparatus 100 according to the exemplary embodiment. The plasma processing apparatus 100 has the shower head 16 serving as the upper electrode. In FIG. 12, the shower head 16 corresponds to the temperature adjusting device. The shower head 16 is equipped with the main body 16a and the ceiling plate 16b. The main body 16a has a flat bottom surface, and a flow path 220 is formed along the bottom surface. The flow path 220 has, at one end thereof, an inlet opening 220a connected to a coolant inlet line 221, and has, at the other end thereof, an outlet opening 220b connected to a coolant outlet line 221b. The shower head 16 reaches a high temperature by receiving heat input from the plasma. The plasma processing apparatus 100 is configured to control a temperature of the shower head 16 by allowing a coolant to flow in the flow path 220. The design method of the present exemplary embodiment may be applied to this flow path 220, and the flow path 220 may be formed such that a thickness between this flow path 220 and the bottom surface of the main body 16a increases as it goes from the outlet opening 220b toward the inlet opening 220a. With this configuration, the flow path 220 is capable of making the temperature of the bottom surface of the main body 16a approximately uniform, so that the temperature difference within the surface of the shower head 16 can be reduced.

Further, the above exemplary embodiment has been described for the example where the plasma is the heat source from which the heat is inputted to the placing table 2 and the heat from the plasma is radiated in the flow path 20. However, the exemplary embodiment is not limited thereto. The heat source may not be the plasma. In the placing table 2, a heater as the heat source may be provided in the entire placing surface 6e to control the temperature of the wafer 8. In such a case, by designing the flow path 20 in consideration of the heat input from the heater as well, the temperature difference within the surface of the wafer 8 and the placing surface 6e and the temperature difference within the top surface 2b of the base 2a can be reduced even if the heater is provided.

Moreover, the above exemplary embodiment has been described for the example where the placing table 2 is cooled by circulating the heat transfer medium such as the coolant having a temperature lower than that of the placing table 2 in the flow path 20. However, the exemplary embodiment is not limited thereto. A temperature control of heating the placing table 2 may be performed by circulating a heat transfer medium having a temperature higher than that of the placing table 2 in the flow path 20. In this case, by altering a sign of the heat flux q" (q"(x)) or the like appropriately, the temperature difference within the wafer 8 and the placing surface 6e and the temperature difference within the top surface 2b of the base 2a can be reduced even if the temperature control of heating the placing table 2 is performed.

Further, the above exemplary embodiment has been described for the example where the number of the flow path 20 formed in the placing table 2 is one. However, the exemplary embodiment is not limited thereto. The flow path 20 may include multiple flow paths provided in a central portion, a middle portion and an outer portion arranged concentrically around the placing table 2 within the base 2a. In such a case, by circulating coolants having different temperatures in the multiple flow paths, the temperature distribution in which the temperature gradient is formed from the center of the placing table 2 in a diametrical direction and the temperature difference is reduced in the circumferential direction can be achieved.

Moreover, though the above-described plasma processing apparatus 100 is the capacitively coupled plasma processing apparatus, the exemplary embodiment is applicable to any of various types of plasma processing apparatuses. By way of example, the plasma processing apparatus 100 may be any of various types such as an inductively coupled plasma processing apparatus, a plasma processing apparatus configured to excite a gas by a surface wave such as a microwave, and so forth.

In addition, though the above-exemplary embodiment has been described for the example where the first RF power supply 10a and the second RF power supply 10b are connected to the base 2a, a configuration of the plasma source may not be limited thereto. For example, the first RF power supply 10a for plasma formation may be connected to the shower head 16 which serves as the upper electrode. Further, the second RF power supply 10b for ion attraction (bias) may not be connected to the base 2a.

Further, though the above-described exemplary embodiment is the plasma processing apparatus configured to perform the etching as the plasma processing, the exemplary embodiment may be applicable to a plasma processing apparatus configured to perform any of various types of plasma processings. By way of non-limiting example, the plasma processing apparatus 100 may be a single-wafer deposition apparatus configured to perform a chemical vapor deposition (CVD), an atomic layer deposition (ALD), a physical vapor deposition (PVD), or the like, or a plasma processing apparatus configured to perform plasma annealing, plasma implantation, or the like.

Furthermore, though the above exemplary embodiment has been described for the example where the semiconductor wafer is used as the substrate, the exemplary embodiment is not limited thereto. By way of example, the substrate may be any of various types, such as a glass substrate.

According to the exemplary embodiment, it is possible to reduce a temperature difference within the first surface.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A temperature adjusting device, comprising:
a first member having thereon a first surface as a temperature control target; and
a flow path formed within the first member along the first surface, a first end of the flow path serving as an inlet opening through which a heat transfer medium is introduced and a second end of the flow path serving as an outlet opening through which the heat transfer medium is discharged,
wherein the first member comprises multiple members provided between the first surface and a placing surface on which a substrate is placed, and
the flow path is formed such that a thermal resistance between the first surface and the flow path increases as the flow path goes from the outlet opening toward the inlet opening,
wherein the flow path is formed such that a thickness between the flow path and the first surface gradually increases as the flow path goes from the outlet opening toward the inlet opening, and
wherein at a certain point of the flow path, an increase rate of the thickness between the flow path and the first surface changes.

2. The temperature adjusting device of claim 1,
wherein the flow path is formed such that an increment degree of the thermal resistance in a thermal entrance region in which a temperature boundary layer is not developed yet by the heat transfer medium introduced from the inlet opening is larger than an increment degree of the thermal resistance in a thermally fully developed region in which the temperature boundary layer is developed.

3. The temperature adjusting device of claim 2,
wherein the flow path is formed to satisfy a following expression 1 in the thermally fully developed region when, at a position x along the flow path, a thermal resistance of an i-th member between the substrate and the flow path including the first member and the multiple members is referred to as $R_i(x)$; a temperature of the substrate, $T_w$; a temperature of the heat transfer medium, $T_m(x)$; a heat flux to the substrate, $q''(x)$; and a heat transfer coefficient of the flow path, $h_\infty$.

[Expression 1]

$$\sum_{i=1}^{n} R_i(x) = \frac{T_W - T_m(x)}{q''(x)} - \frac{1}{h_\infty} \quad (1)$$

4. The substrate processing apparatus of claim 2,
wherein the flow path is formed to satisfy a following expression 2 in the thermal entrance region when, at a position x along the flow path, a thermal resistance of an i-th member between the substrate and the flow path including the first member and the multiple members is referred to as $R_i(x)$; a temperature of the substrate, $T_w$; a temperature of the heat transfer medium, $T_m(x)$; a heat flux to the substrate, $q''(x)$; and a heat transfer coefficient of the flow path, $h(x)$.

[Expression 2]

$$\sum_{i=1}^{n} R_i(x) = \frac{T_W - T_m(x)}{q''(x)} - \frac{1}{h(x)} \quad (2)$$

5. The temperature adjusting device of claim 1,
wherein at the certain point, the increase rate of the thickness between the flow path and the first surface discontinuously changes.

6. The temperature adjusting device of claim 5,
wherein, the increase rate of the thickness between the second end and the certain point is lower than the increase rate of the thickness between the certain point and the first end.

7. The temperature adjusting device of claim 1,
wherein heat is inputted to the first surface of the first member from a heat source, and
the flow path is formed such that the thermal resistance between the first surface and the flow path increases as the flow path goes from the outlet opening toward the inlet opening according to a temperature gradient of the heat transfer medium which flows from the inlet opening toward the outlet opening.

* * * * *